(12) United States Patent
Park et al.

(10) Patent No.: US 8,242,755 B2
(45) Date of Patent: Aug. 14, 2012

(54) SWITCH CONTROL DEVICE AND CONVERTER INCLUDING THE SAME

(75) Inventors: Young-Bae Park, Anyang (KR); Hang-Seok Choi, Gunpo (KR); Ki-Tae Kim, Bucheon (KR)

(73) Assignee: Fairchild Korea Semiconductor Ltd., Bucheon, Kyungki-do (KR)

( * ) Notice: Subject to any disclaimer, the term of this patent is extended or adjusted under 35 U.S.C. 154(b) by 675 days.

(21) Appl. No.: 12/486,322

(22) Filed: Jun. 17, 2009

(65) Prior Publication Data
US 2009/0323374 A1 Dec. 31, 2009

(30) Foreign Application Priority Data

Jun. 25, 2008 (KR) .................. 10-2008-0060249

(51) Int. Cl.
*G05F 1/00* (2006.01)
(52) U.S. Cl. ............... 323/222; 323/901; 363/53
(58) Field of Classification Search .......... 323/222, 323/901, 908; 363/50, 52–53
See application file for complete search history.

(56) References Cited

U.S. PATENT DOCUMENTS

| | | | |
|---|---|---|---|
| 5,367,247 A | 11/1994 | Blocher et al. | |
| 5,592,128 A | 1/1997 | Hwang | |
| 5,726,871 A | 3/1998 | Choi | |
| 5,757,635 A | 5/1998 | Seong | |
| 6,222,746 B1 | 4/2001 | Kim | |
| 7,397,678 B2 * | 7/2008 | Frank et al. | 363/89 |
| 2007/0290658 A1 * | 12/2007 | Chen | 323/222 |

* cited by examiner

*Primary Examiner* — Harry Behm
*Assistant Examiner* — Matthew Grubb
(74) *Attorney, Agent, or Firm* — Alston & Bird LLP (57) ABSTRACT

The present invention relates to a switch control device and a converter including the same. According to an exemplary embodiment of the present invention, the switch control device includes a PWM controller for forcing a power switch to turn on when the power switch is turned off during a predetermined period, a current sensor for determining whether a current flows through the power switch, and a conditional counter for determining that an input voltage is input to a power transmission element by using a sense result of the current sensor and a number of times that the PWM controller turns on the power switch by force.

22 Claims, 8 Drawing Sheets

SWITCH CONTROL DEVICE AND CONVERTER INCLUDING THE SAME

CROSS-REFERENCE TO RELATED APPLICATION

This application claims priority to and the benefit of Korean Patent Application No. 10-2008-0060249 filed in the Korean Intellectual Property Office on Jun. 25, 2008, the entire contents of which are incorporated herein by reference.

BACKGROUND OF THE INVENTION (a) Field of the Invention

The present invention relates to a switch control device and a converter including the same. In particular, the present invention relates to a switch control device for safely controlling a converter when information of an input voltage of a converter is not input to the switch control device, and a converter including the same.

(b) Description of the Related Art

Figure 1:
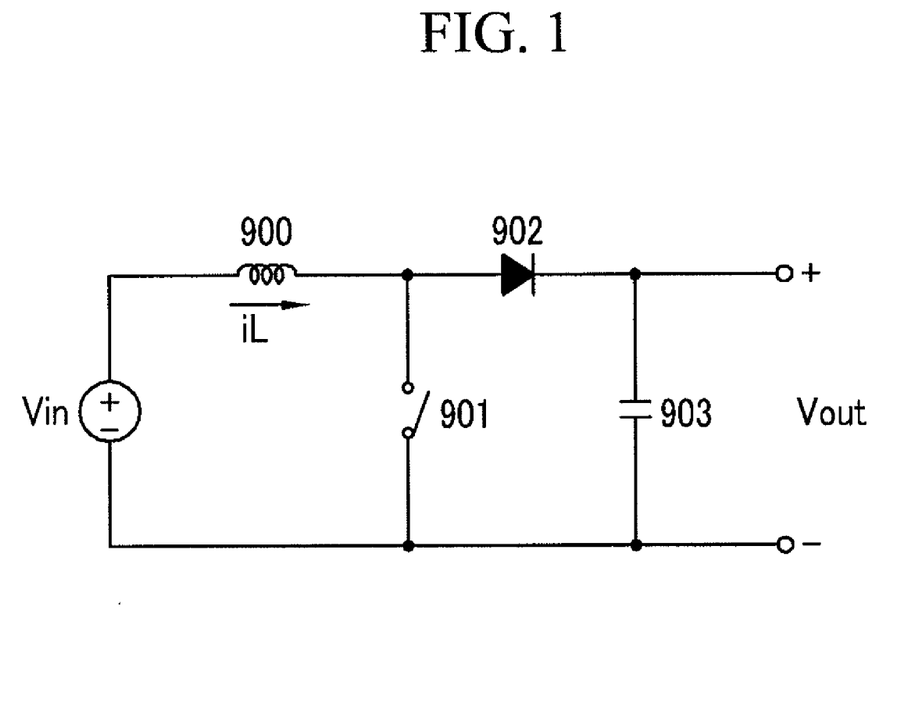
FIG. 1 shows the conventional converter.

FIG. 1 equivalently shows a converter. The converter includes an inductor 900, a switch 901, a diode 902, and a capacitor 903. An inductor current iL flows through the inductor 900 according to an input voltage Vin, the capacitor 903 is charged by the inductor current iL, and a charged voltage at the capacitor 903 becomes an output voltage of the converter. When the switch 901 is in the turn-on state and the diode 902 is in the turn-off state, the inductor current iL is increased with the passage of time and the inductor 900 stores energy. When the switch 901 is turned off and the diode is turned on, the inductor current iL passing through the diode 902 charges the capacitor 903. In this instance, the energy stored in the inductor 900 is transmitted to the capacitor 903 and the inductor current iL is reduced with the passage of time.

The conventional controller controls an operation of the convertor during a predetermined period even though the input voltage is not input to the converter. The controller controls an operation of the converter during a period or two periods of the input AC voltage without the input voltage. Then, it makes the output voltage be reduced that there is no input voltage, even though the converter is normally operating. The controller controls the converter to operate with a maximum gain in order to compensate for the decreasing output voltage. A switching frequency of the converter must be a minimum and a duty of the switching must be a maximum for the converter to operate at the maximum gain.

When the input AC voltage is again input to the converter operating according to the maximum gain, since the switching is operated according to the maximum duty, a peak value of a current flowing through the switch is suddenly increased.

The present invention has been made in an effort to provide a switch control device and a converter including the same having advantages of controlling a converter when information of an input voltage is not input to a controller controlling a converter. When a converter is operated at a maximum gain without an input voltage and then an input AC voltage is input to the converter, a large current is generated to the converter operated at the maximum gain. A configuration (e.g., a switching element of a converter, etc) of the converter is damaged by the large generated current. Particularly, during an operation of the converter, when a blackout is generated at the moment or after the input voltage is unstable and a low voltage is applied, when the input AC voltage is recovered, a switch current is sharply increased, and hence, because of damage to the converter and the sharp increase of the switch current, an interruption is generated in a soft start operation.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a switch control device and a converter including the same for safely controlling an operation of a converter when an input voltage is not input and then is input and controlling a soft start operation.

In one aspect of the present invention, a switch control device for controlling a switching operation of a power switch for controlling power transmission of a power transmission element includes a PWM controller for forcing the power switch to turn on when the power switch is turned off during a predetermined period, a current sensor for sensing whether a current flows through the power switch, and a conditional counter for determining whether an input voltage is input to a power transmission element by using a sense result of the current sensor and a number of times that the PWM controller forces the power switch to turn on.

The switch control device reduces a switching duty of the power switch when the input voltage is not input during a threshold period. The PWM controller generates an on pulse signal to turn on the power switch when the power switch is turned off during the predetermined period. The conditional counter counts a number of times that the on pulse signal is generated while no current flows through the power switch and determines that the input voltage is not input during a threshold period when the count result is greater than a predetermined number corresponding to the threshold period. The current sensor generates a current sense signal according to the sense result.

The conditional counter logically operates the on pulse signal and the current sense signal, generates a pulse signal according to the logical operation result, counts the generated pulse signals, and generates a disable signal to reduce a switching operation duty of the power switch when the count result of the generated pulse signals is the same as a threshold number. The conditional counter includes a logical operator for logically operating the on pulse signal and the current sense signal, a counter for counting the generated pulse signal, and flip-flops for generating and maintaining the disable signal according to the result of the counter.

The conditional counter includes at least one T flip-flop corresponding to the threshold number. The result of the logical operator is input to a clock terminal of the at least one T flip-flop, and the at least one T flip-flop and the flip-flop are reset when a current flows through the power switch. The current sensor receives a sense signal that corresponds to the current flowing through the power switch and determines that the current flows through the power switch when the sense signal is greater than a predetermined level.

In one aspect of the present invention, a switch control device further includes an output voltage sensor for receiving an output voltage sense signal corresponding to an output voltage according to the power that is transmitted from the power transmission element and for generating an error amplification signal corresponding to the difference between the output voltage sense signal and a predetermined reference voltage, and a duty determination unit for determining a turn-off time of the power switch by using the error amplification signal.

The duty determination unit determines the turn-off time by using a predetermined output reference voltage instead of the error amplification signal according to the disable signal. The output voltage sensor includes an error amplifier for amplifying and outputting the difference between the output voltage sense signal and a predetermined reference voltage, and a switching element for transmitting the output reference voltage to the duty determination unit in response to the disable signal. The duty determination unit includes a comparator to which the error amplification signal and a sawtooth wave signal having a predetermined frequency are input. The output reference voltage instead of the error amplification signal is input to the comparator according to the disable signal. The output reference voltage is high and near a lowest level of the sawtooth wave signal.

In one aspect of the present invention, the switch control device further includes an output voltage sensor that receives the output voltage sense signal corresponding to an output voltage according to the power transmitted from the power transmission element and generates an error amplification signal corresponding to the difference between the output voltage sense signal and a predetermined reference voltage, and a duty determination unit for determining a turn-off time of the power switch by using a soft signal during a predetermined period from the time when the input signal begins to be input to the power transmission element and by using the error amplification signal after the predetermined period.

The duty determination unit determines the turn-off time by using a predetermined output reference voltage instead of the error amplification signal according to the disable signal. The output voltage sensor includes an error amplifier for amplifying and outputting the difference between the output voltage sense signal and a predetermined reference voltage, and a switching element for transmitting the output reference voltage to the duty determination unit in response to the disable signal. The duty determination unit includes a comparator to which the soft start signal and a sawtooth wave signal having a predetermined frequency is input. The output reference voltage instead of the error amplification signal is input to the comparator according to the disable signal. The comparator compares a lower signal between the soft start signal and the error amplification signal and the sawtooth wave signal. The output reference voltage is higher than a lowest level of the sawtooth wave signal.

In another aspect of the present invention, a converter includes a power transmission element, a power switch that is connected to a first terminal of the power transmission element and controls power transmission through the power transmission element, and a switch controller for controlling a switching operation of the power switch.

The switch controller determines whether an input voltage is input to the power transmission element by sensing a current flowing through the power switch and counting a number of times that a PWM controller is turned on by the power switch by force, when the power switch is turned off during a predetermined period. The switch controller reduces a switching duty of the power switch when the input voltage is not input during a threshold period, and generates an on pulse signal to turn on the power switch when the power switch is turned off during a predetermined period. The switch controller counts a number of times that the on pulse signal is generated while no current flows through the power switch and determines that the input voltage is not input during a threshold period when the count result is greater than a predetermined threshold number corresponding to the threshold period. The switch controller generates a current sense signal according to sensing of the current flowing through the power switch, logically operates the on pulse signal and the current sense signal, generates a pulse signal according to the logical operation result, counts the generated pulse signal, and generates a disable signal to reduce the duty of the power switch when the count result of the generated pulse signal is the same as the threshold number.

As described above, according to an aspect of the present invention, the present invention provides a switch control device and a converter including the same for safely controlling an operation of a converter when an input voltage is unstably input and controlling a soft start operation.

DETAILED DESCRIPTION OF THE EMBODIMENTS

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Figure 2:
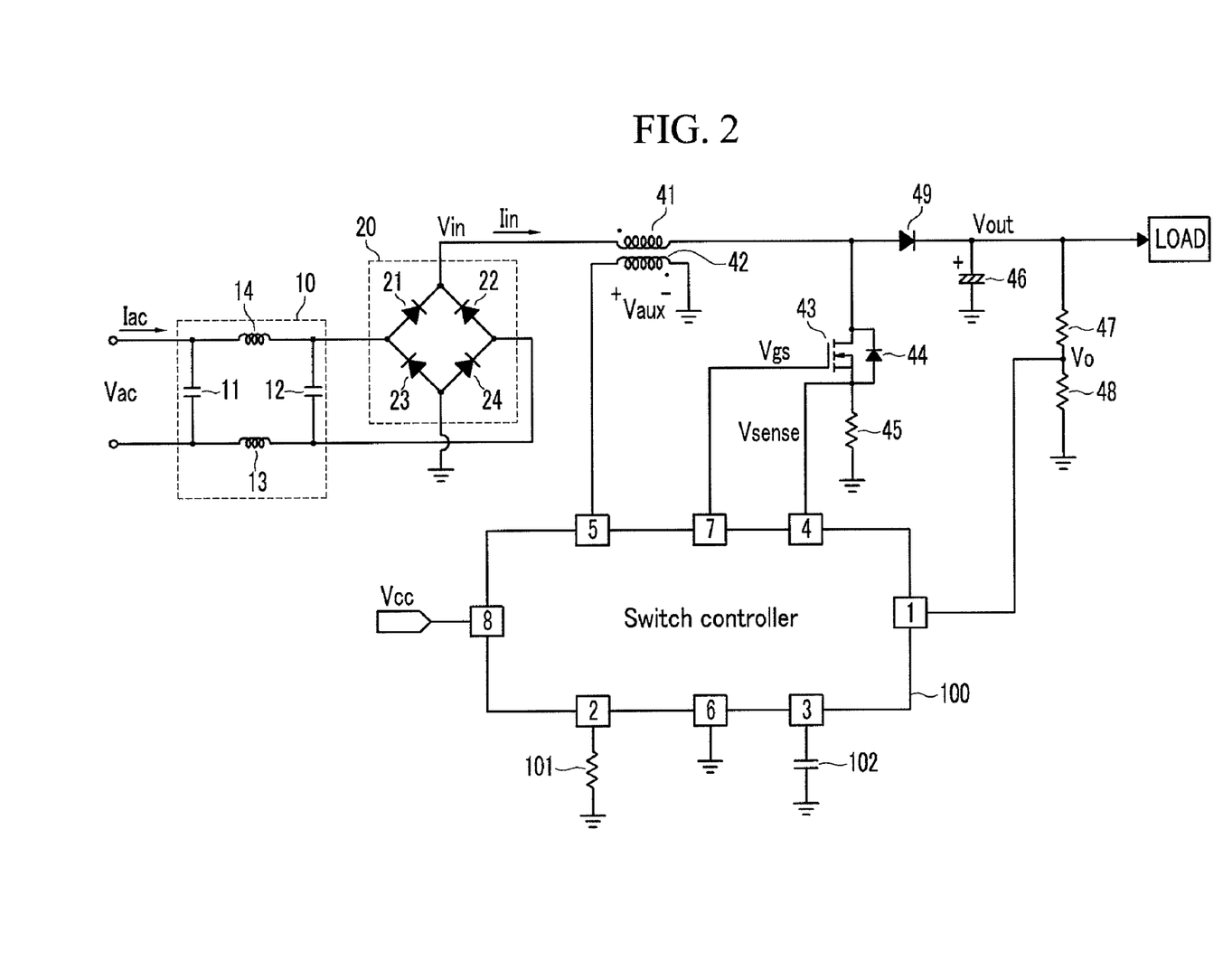
FIG. 2 shows a converter according to an exemplary embodiment of the present invention.

FIG. 2 shows a converter according to an exemplary embodiment of the present invention. The converter includes a line filter 10, a bridge diode 20, an inductor 41, a power switch 43, a capacitor 46, a sense resistor 45, a detection inductor 42, a diode 49, output voltage division resistors 47 and 48, and a switch controller 100. A body diode 44 is formed in parallel with the power switch 43.

The line filter 10 is configured by capacitors 11 and 12 and inductors 13 and 14, and removes noise components of an input AC voltage Vac and an input AC current Iac. The capacitor 11 and the capacitor 12 are connected in parallel, the inductor 13 is connected between a first terminal of the capacitor 11 and a first terminal of the capacitor 12, and the inductor 14 is connected between a second terminal of the capacitor 11 and a second terminal of the capacitor 12. The bridge diode 20 is configured by four diodes 21 to 24, and rectifies full-waves of the input AC voltage Vac and the input AC current Iac and then generates an input voltage Vin and an input current Iin.

The inductor 41 being a power transmission element stores energy while the power switch 43 is turned on. When the power switch 43 is turned off, the input voltage Vin and the stored energy in the inductor 41 are supplied to an output terminal of the converter through the diode 49. A first terminal of the inductor 41 is connected to an output terminal of the bridge diode 20, and a second terminal of the inductor 41 is connected to an anode of the diode 49 and the power switch 43.

The detection inductor 42 has a predetermined winding ratio with respect to the inductor 41. When the number of winds of the inductor 41 is N and the number of winds of a detection inductor is "1", the predetermined winding ratio becomes 1/N. A voltage of the inductor 41 is changed according to the winding ratio, and the changed voltage is applied to the detection inductor 42. The voltage applied to the detection inductor 42 is a detection voltage Vaux, and the detection voltage Vaux is used to control an operation of zero-current switching of the power switch 43.

The zero-current switching will be described in more detail. The power switch 43 is configured by an N-channel type metal-oxide semiconductor field-effect transistor (NMOSFET) and is turned on/off according to a gate control signal Vgs of the switch controller 100. A drain electrode of the power switch 43 is connected to an anode of the diode 49 and the second terminal of the inductor 41, a source electrode of the power switch 43 is connected to a first terminal of the sense resistor 45, and a second terminal of the sense resistor 45 is grounded.

The switch controller 100 uses a voltage Vsense at the first terminal of the sense resistor 45 to determine a turn-off time of the power switch 43. The power switch 43 is turned on by a high level gate control signal Vgs and is turned off by a low level gate control signal Vgs. A current flowing through the turned-on power switch 43 flows through the sense resistor 45 and the sense voltage Vsense is generated. The current flowing through the power switch 43 and the sense voltage Vsense have a same waveform.

A cathode of the diode 49 is connected to a first terminal of the capacitor 46, a current flowing through the inductor 41 flows through the diode 49 when the power switch 43 is turned off, and the input current Iin through the inductor 41 is supplied to the capacitor 46 and a LOAD. While the input current Iin flows through the diode 49, the capacitor 46 is charged by a part of the input current Iin. While the diode 49 is turned off and the input current Iin does not flow, the capacitor 46 is discharged and supplies a power to the LOAD. The division resistors 47 and 48 divide an output voltage Vout and generate a voltage Vo.

The switch controller 100 includes connection terminals 1 to 8 that are realized as eight pins. The voltage Vo is input to the connection terminal 1, and the connection terminals 2 and 3 are respectively connected to a resistor 101 and a capacitor 102. The resistor 101 is used when the switch controller 100 generates a sawtooth wave, and the capacitor 102 adjusts a gain of a voltage that is generated by amplifying a voltage between the voltage Vo and a predetermined reference voltage, according to frequency bands.

The sense voltage Vsense is input to the connection terminal 4, the detection voltage Vaux is input to the connection terminal 5, and a power source voltage Vcc required to operate the switch controller 100 is supplied to the connection terminal 8. The gate control signal Vgs is outputted through the connection terminal 7 and the connection terminal 6 is grounded. When the converter is normally operated, the switch controller 100 controls a switching operation of the power switch 43 by using the detection voltage Vaux and the voltage Vo.

The switch controller 100 detects a current flowing through the power switch 43 by using the sense voltage Vsense. The switch controller 100, by using the sense voltage Vsense, determines whether the input voltage Vin is input. When the input voltage Vin is not input for longer than a threshold period, the switch controller 100 determines that the converter is in an abnormal state in which the input voltage Vin is not input. Then, the switch controller 100 controls the switching operation of the power switch 43 with a minimum duty after the threshold period. The switch controller 100 controls the switching operation of the power switch 43 according to the detection voltage Vaux and the voltage Vo during the threshold period and after the time when the voltage Vin is input while controlling the switching operation of the power switch 43 with a minimum duty after the threshold period.

Figure 3:
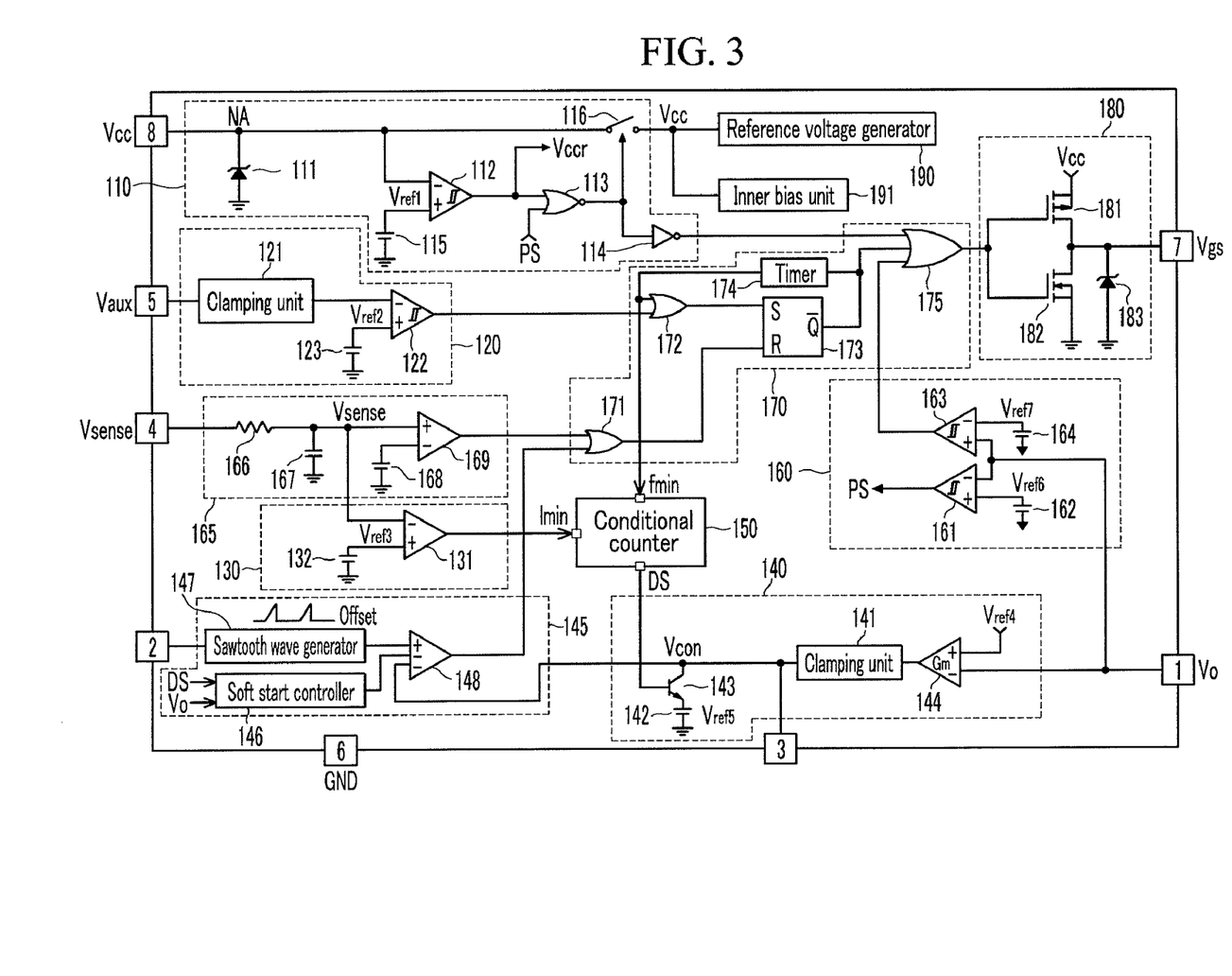
FIG. 3 shows a switch controller 100 according to an exemplary embodiment of the present invention.

Next, referring to FIG. 3, the switch controller 100 according to an exemplary embodiment of the present invention will be described in detail. FIG. 3 shows the switch controller 100 according to an exemplary embodiment of the present invention.

The switch controller 100 includes a under-voltage lockout (UVLO) 110, a zero-current detector 120, a minimum current sensor 130, an output voltage sensor 140, a duty determination unit 145, a conditional counter 150, a first protection circuit 160, a second protection circuit 165, a PWM controller 170, a gate driver 180, a reference voltage generator 190, and an inner bias unit 191.

When the power source voltage Vcc is less than a predetermined reference, the UVLO 110 stops a switching operation of the power switch 43 to prevent an incorrect operation of the switch controller 100. The UVLO 110 compares the voltage Vcc input through the connection terminal 8 and a first reference range Vref1, and stops a switching operation of the power switch 43 when the voltage Vcc is less than the first reference range Vref1 such that the incorrect operation of the switch controller 100 can be prevented in advance. A minimum value of the first reference range Vref1 is a minimum voltage for the switch controller 100 to operate under stable conditions, and a maximum value of the first reference range Vref1 is higher than the minimum value by a predetermined value.

The UVLO 110 includes a Zener diode 111, a hysteresis comparator 112, a NOR gate 113, an inverter 114, a reference voltage source 115, and a turn-off switch 116. An anode of the Zener diode 111 is grounded and a cathode of the Zener diode 111 is connected to the connection terminal 8. When the power source voltage Vcc is greater than a breakdown voltage at the Zener diode 111, the Zener diode 111 is turned on, and a voltage at NA becomes the breakdown voltage. Then, damage to the switch controller 100 by an over voltage of the electronic power source voltage Vcc can be prevented.

The hysteresis comparator 112 receives the power source voltage Vcc and a reference voltage of the reference voltage source 115 and determines whether the power source voltage Vcc is in a normal range in order for the switch controller 100 to operate normally. According to the hysteresis characteristic, the hysteresis comparator 112 compares the first reference range Vref1 that has a predetermined range with the reference voltage input to a non-inversion terminal (+) as the center and the power source voltage Vcc input to an inversion terminal (−), and determines a level of an output signal Vccr according to the comparison result.

When the power source voltage Vcc is less than the minimum value of the first reference range Vref1, a high level signal Vccr is output, when the power source voltage Vcc is greater than the maximum value of the first reference range Vref1, a low level signal Vccr is output, and when the power source voltage Vcc is covered by the first reference range Vref1, the current level of the signal Vccr is maintained. That is, when the power source voltage Vcc is less than the minimum value of the first reference range Vref1, the power source voltage Vcc is determined to be an abnormal voltage and the power switch 43 is turned off, and the turn-off switch 116 is turned off, and then the power source voltage Vcc is not input to the switch controller 100.

Particularly, the turn-off switch 116 is turned on/off according to an output of the NOR gate 113. That is, when an output of the NOR gate 113 is low-level, the switch 116 is turned off, and when an output of the NOR gate 113 is high-level, the switch 116 is turned on. When the power source voltage Vcc is under a minimum value of the first reference range Vref1, the hysteresis comparator 112 outputs a high level signal Vccr and the NOR gate 113 transmits a low level output signal to the switch 116 regardless of an output signal PS level of the first protection circuit 160. Then, the switch 116 is turned off and the power source voltage Vcc is not transmitted.

The zero-current detector 120 receives the detection voltage Vaux, senses the time when a current flowing through the inductor 41 is 0 by using the detection voltage Vaux, and determines a turn-on time point of the power switch 43. When the power switch 43 is turned off, an inductor 41 current flows to the diode 49 and is then supplied to the capacitor 46 and the LOAD. When no more current flows through the inductor 41, resonance occurs between the parasitic capacitance of the turned-off switch 43 and the inductor 41. Then, a voltage at both terminals of the inductor 41 has a resonance waveform and the detection voltage Vaux has a value of which the voltages at both terminals of the inductor 41 are multiplied by a winding ratio.

At this time, the zero-current detector 120 senses the detection voltage Vaux and determines the time when the detection voltage Vaux becomes less than a predetermined voltage as the time when no current flows through the inductor 41. If the zero-current detector 120 determines the time when no current flows through the inductor 41, the zero-current detector 120 outputs a signal for turning on the power switch 43 when a predetermined period has passed from the time. The zero-current detector 120 detects the time when the sense voltage is reduced in order to detect the time when the current of the inductor becomes 0, and the power switch 43 is turned on when a voltage at both terminals of the power switch 43 are lowest in order to reduce a switching loss.

The zero-current detector 120 detects the time when no current flows through the inductor in order to detect the time when voltages at both terminals of the power switch 43 are minimum. That is, the zero-current detector 120 compares the detection voltage Vaux and a predetermined reference value, detects the time when no current flows through the inductor 41 (hereinafter, a zero-current time), and controls the PWM controller 170 to turn on the power switch 43 at the time when the voltages at both terminals of the power switch 43 are the lowest (hereinafter, a minimum voltage time). The minimum voltage time is delayed from the zero-current time by a predetermined period. At this time, the predetermined period can be generated by a propagation delay of the switch controller 100. When it needs more delay time than the transmission delay of the switch controller 100, the switch controller 100 can further include a delay unit to generate additional delays.

The period between the minimum voltage time and the zero-current time is different according to a converter, and it is determined by the predetermined period whether the delay unit is necessary. If the predetermined period is longer than the propagation delay, the delay unit is necessary. At this time, the delay unit has to delay the output signal of the hysteresis comparator 122 for turning on the power switch 43 on the minimum voltage time by considering the propagation delay of the switch controller 100. A person of ordinary skill in the art knows that the delay unit can be realized by using a resistor and a capacitor.

The zero-current detector 120 includes a clamping unit 121, a hysteresis comparator 122, and a reference voltage source 123. The clamping unit 121 locks a voltage range of the detection voltage Vaux to be a predetermined range. Particularly, when a detection voltage Vaux in a low negative voltage range or a high positive voltage range is input, the zero-voltage detector 120 can be damaged. When the detection voltage Vaux is lower than a predetermined second reference range Vref2 with reference to the reference voltage supplied by the reference voltage source 123, the hysteresis comparator 122 generates a high level signal. When the detection voltage Vaux is higher than the second reference range Vref2, the hysteresis comparator 122 generates a low level signal. When the detection voltage Vaux is within the second reference range Vref2, the hysteresis comparator 122 maintains a current output signal.

The second reference range Vref2 can be set to a range for sensing the zero-current time. The generated output signal of the hysteresis comparator 122 is input to the PWM controller 170. The minimum current sensor 130 receives the sense voltage Vsense and determines whether the current flows to the power switch 43. The sense voltage Vsense is a sense signal that corresponds to the current flowing to the power switch 43. According to an exemplary embodiment of the present invention, the sense voltage Vsense is a voltage signal generated by the current of the power switch 43 flowing to the sense resistor 45. However, the embodiment of the present invention is not limited thereto, and a sensor directly sensing a current can be used.

When the input voltage Vin is not input, no current flows through the power switch 43 even though the power switch 43 is turned on. The minimum current sensor 130 includes a comparator 131 and a reference voltage source 132. The sense voltage Vsense and the reference voltage Vref3 are respectively input to an inversion terminal (−) and a non-inversion terminal (+) of the comparator 131. The reference voltage source 132 supplies the reference voltage Vref3. The minimum current sensor 130 compares the sense voltage Vsense and the reference voltage Vref3 and determines whether a current flows through the power switch 43. When the sense voltage Vsense is greater than the reference voltage Vref3, the current sensor 130 determines that a current flows through the power switch 43. When the sense voltage Vsense is less than the reference voltage Vref3, the current sensor 130 determines that a current flowing through the power switch 43 is near "0". The reference voltage Vref3 can be set to be a very low voltage near a ground voltage.

When there is no input voltage Vin, a small current can flow through the power switch 43 during the turn-on period of the power switch 43. The minimum current sensor 130 can determine that the input voltage Vin is to be input when there is no input voltage Vin because of the small current. The reference voltage Vref3 can be set to be a voltage that is very near a ground voltage and greater than the ground voltage in order to prevent incorrect operation of the minimum current sensor 130. A specific value can be set according to a device in which the switch controller 100 is used according to an exemplary embodiment of the present invention.

In the present invention, when the input voltage Vin is normally input, the reference value can be set by the current flowing through the power switch 43 after a short period from the time when the power switch 43 is turned on. A sense voltage Vsense when the reference value flows through a sense resistor Rsense can be set to be the reference voltage Vref3. When the sense voltage Vsense is less than the reference voltage Vref3, the comparator 131 outputs a high level current sense signal Imin. When the sense voltage Vsense is greater than the reference voltage Vref3, the comparator 131 outputs a low level current sense current sense signal Imin. That is, the current sense signal Imin becomes high when no current flows through the power switch 43, and the current sense signal Imin becomes low when a current flows through the power switch 43.

The output voltage sensor 140 compares a signal corresponding to the output voltage and a predetermined error reference voltage and generates an error amplification signal Vcon, and the duty determination unit 145 determines a turn-off time of the power switch 43 by using the error amplification signal Vcon and a predetermined duty reference signal. According to an exemplary embodiment of the present invention, the predetermined duty reference signal is a sawtooth wave signal. However, the present invention is not limited thereto.

The output voltage sensor 140 includes an error amplifier 144, a clamping unit 141, a reference voltage source 142, and a BJT 143. The duty determination unit 145 includes a sawtooth wave generator 147, a comparator 148, and a soft start controller 146. The sawtooth wave generator 147 includes a current source (not shown) and generates a sawtooth wave SW by using a resistor 101 and the current source. The resistor 101 is connected with the switch controller 100 through a connection terminal 2.

The sawtooth wave SW is a voltage signal that is increased with a predetermined slope during the period when the power switch 43 is turned on, and the lowest level of the sawtooth wave SW is an offset voltage. At a start-up operation of the converter or when the input voltage Vin is again input while the input voltage Vin is not input, the soft start controller 146 outputs a soft start signal SS to the comparator 148.

The soft start signal SS is linearly increased in a staircase manner. In detail, when a voltage Vo corresponding to the output voltage Vout is less than a predetermined level reference signal, the soft start controller 146 can determine a start-up operation. When a signal DS is reduced from a high level to a low level, the soft start controller 146 can determine that the input voltage Vin is input again. When the soft start controller 146 determines the start-up operation or that the input voltage Vin is input again, it generates and outputs the soft start signal SS that is linearly increased or in a staircase manner from the ground voltage. The soft start controller 146 generates the soft start signal SS that is linearly increased in a staircase manner for a predetermined period from the start-up operation or for a predetermined period from the time the input voltage Vin is input again. When the predetermined period is finished, the soft start controller 146 generates a high level soft start signal SS and maintains it. At this time, the high level can be higher than a maximum voltage that can be output from the clamping unit 141.

The comparator 148 includes two inversion terminals (−) and one non-inversion terminal (+), compares a lower signal between signals input to the two inversion terminals (−) and a signal input to the non-inversion terminal (+), and determines a level of the output signal. Accordingly, the comparator 148 compares a low level signal between the soft start signal SS and the signal Vcon and the sawtooth wave SW, outputs a high level signal when the sawtooth wave SW is greater than the low level signal, and outputs a low level signal when the sawtooth wave SW is less than the low level signal.

The error amplifier 144 receives a reference voltage Vref4 that is input to the non-inverting terminal (+) and the voltage Vo that is input to the inversion terminal (−), amplifies the difference between both voltages as a predetermined gain Gm, and generates an output signal. The clamping unit 141 locks it to be a predetermined voltage when the output signal of the error amplifier 144 is greater than a predetermined voltage. The capacitor 102 connected to the connection terminal 3 adjusts a gain of an output voltage of the error amplifier 144 according to the frequency band.

A collector electrode of the BJT 143 is connected to the inversion terminal (−) of the comparator 148, the connection terminal 3, and the clamping unit 141. A base electrode of the BJT 143 is applied a signal DS from the conditional counter 150, and an emitter electrode of the BJT 143 is connected to the reference voltage source 142. The reference voltage source 142 supplies an output reference voltage Vref5. When the signal DS is low, the BJT 143 is in the turn-off state. When the signal DS is high, the BJT 143 is turned on and a level of the signal Vcon becomes the output reference voltage Vref5. The conditional counter 150 outputs a high-level signal DS when the input signal Vin is not input during a predetermined period. Then, the level of the signal Vcon becomes the output reference voltage Vref5, which is transmitted to the inversion terminal (−) of the comparator 148.

At this time, the output reference voltage Vref5 is near the offset voltage 1V of the sawtooth wave SW and is set to be a little higher than the offset voltage 1V. The output signal of the clamping unit 145 has the offset voltage as a minimum value and a maximum value of the sawtooth wave SW as a maximum value. The duty of the power switch 43 is determined according to the signal Vcon and the sawtooth wave voltage SW. When the signal Vcon is maintained for the same period as the offset voltage, the duty becomes "0". When the signal Vcon is maintained at the maximum value, the duty becomes a maximum.

The output reference voltage Vref5 is set as a value for controlling the power switch with a predetermined minimum duty (hereinafter, minimum duty) after the input voltage is not input during a predetermined period. The value is a little larger than the offset voltage. Then, after the input voltage is not input for a predetermined period and then the signal DS becomes high, the power switch 43 operates with a minimum duty. That is, according to an exemplary embodiment of the present invention, while the input voltage Vin is not input, the switch controller 100 maintains the turn-on state of the power switch 43 according to a minimum duty. At this time, the minimum duty is determined by the time when the sawtooth wave SW reaches the output reference voltage Vref5. Accordingly, a level of the output reference voltage Vref5 is determined according to the minimum duty.

The comparator 148 compares the sawtooth wave SW and the output reference voltage Vref5, and determines the output according to the comparison result. The conditional counter 150 counts a period when no current flows through the power switch 43. According to the count result, when the period is greater than a predetermined threshold period, the conditional counter 150 determines the abnormal state and reduces the duty of the power switch 43. According to an exemplary embodiment of the present invention, the duty of the power switch 43 is reduced to a minimum.

When a current through the power switch 43 begins to flow again while the conditional counter 150 counts the period when no current flows through the power switch 43, the conditional counter 150 resets the count result. The conditional counter 150 receives an on pulse signal fmin from a timer 174 of the PWM controller 170 and a current sense signal Imin from the current sensor 130 so as to determine whether the input voltage Vin is input.

When the timer 174 does not sense a signal for turning on the power switch 43, the timer 174 generates the on pulse signal fmin for turning on the power switch 43 by force and transmits the on pulse signal fmin to a OR gate 172 so as to control the switching operation of the power switch 43 by using a predetermined threshold minimum switching frequency. At this time, the predetermined threshold minimum switching frequency is a very much lower frequency and can be a predetermined value. When the conditional counter 150 senses the period when the input voltage is not input by using the current sense signal Imin and the on pulse signal fmin and determines that the input voltage is not input for the threshold period, the conditional counter 150 generates and outputs the signal DS. Additionally, the conditional counter 150 resets the count result by using a signal Vccr.

Figure 4:
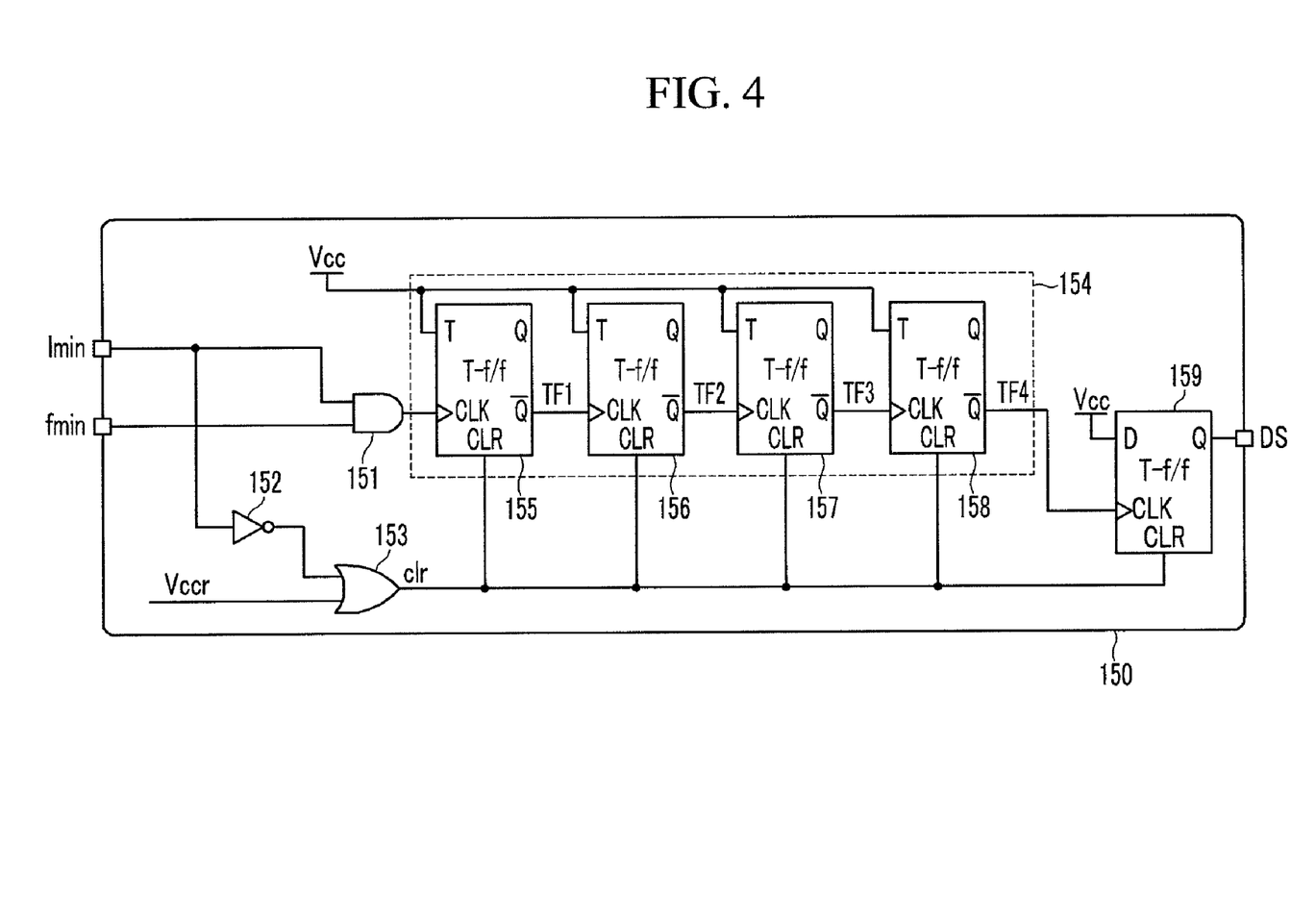
FIG. 4 shows a conditional counter 150 according to an exemplary embodiment of the present invention.

Referring to FIG. 4, a configuration of the conditional counter 150 will be described in detail. FIG. 4 shows the conditional counter 150 according to an exemplary embodiment of the present invention.

The conditional counter 150 includes an AND gate 151, an inverter 152, a NOR gate 153, a 4-bit counter 154 including T flip-flops 155 to 158, and a D flip-flop 159. According to an exemplary embodiment of the present invention, the conditional counter 150 includes the 4-bit counter 154. However, the present invention is not limited thereto. The number of T flip-flops can be determined according to the threshold period.

The AND gate 151 receives the current sense signal Imin and the on pulse signal fmin and determines the level of the output signal according to the levels of the two signals. When the two signals are high, the AND gate 151 outputs a high level signal. When at least one of the two signals is low, the AND gate 151 outputs a low level signal. The inverter 152 receives, inverts, and transmits the current sense signal Imin to the OR gate 153.

The OR gate 153 receives the output signal of the inverter 152 and the reset signal Vccr, and generates a clear signal clr. The OR gate 153 generates a high level clear signal clr when at least one of the input signals is high.

The T flip-flops 155 to 158 and the D flip-flop 159 reset the present output state according to the high level clear signal input to a CLR. Particularly, the T flip-flops 155 to 158 respectively reset inverting output signals TF1 to TF4 to be high and the D flip-flop 159 resets the signal DS to be low. When a high level signal is input to input terminals T of the T flip-flops 155 to 158, the T flip-flops 155 to 158 synchronize with a rising edge of a signal input to a CLK terminal, invert the inverting output signals TF1 to TF4 before the rising edge, generate new inverting output signals TF1 to TF4, and then output through inverting output terminals $\overline{Q}$.

The voltage Vcc applied to the input terminals T of the T flip-flops 155 to 158 is a sufficiently high voltage. Accordingly, at the rising edge of the signal input to the CLK terminals of the T flip-flops 155 to 158, the T flip-flops 155 to 158 respectively invert the inverting output signals TF1 to TF4, generate the new inverting output signals TF1-TF4, and then output to the CLK terminals of the flip-flops 156 to 158 and the D flip-flop 159. The CLK terminal of the T flip-flop 155 is connected to the output terminal of the AND gate 151, generates the new inverting output signal TF1 in synchronization with a rising edge of the output signal of the AND gate 151, and outputs to the CLK terminal of the T flip-flop 156 through the inverting output terminal $\overline{Q}$.

The CLK terminal of the T flip-flop 156 is connected to the inverting output terminal $\overline{Q}$ of the T flip-flop 155, generates the new inverting output signal TF2 in synchronization with a rising edge of the output signal TF1, and outputs to the CLK terminal of the T flip-flop 157 through the inverting output terminal $\overline{Q}$. The CLK terminal of the T flip-flop 157 is connected to the inverting output terminal $\overline{Q}$ of the T flip-flop 156, generates the new inverting output signal TF3 in synchronization with a rising edge of the output signal TF2, and outputs to the CLK terminal of the T flip-flop 158 through the inverting output terminal $\overline{Q}$. The CLK terminal of the T flip-flop 158 is connected to the inverting output terminal $\overline{Q}$ of the T flip-flop 157, generates the new inverting output signal TF4 in synchronization with a rising edge of the output signal TF3, and outputs to the CLK terminal of the D flip-flop 159 through the inverting output terminal $\overline{Q}$.

The D flip-flop 159 outputs the signal of the input terminal D in synchronization with a rising edge of the signal that is input to the CLK terminal of the D flip-flop 159 according to an exemplary embodiment of the present invention. Differing from this, the D flip-flop 159 can output the signal of the input terminal D in synchronization with a falling edge of the signal that is input to the CLK terminal of the D flip-flop 159. Since the voltage Vcc that is applied to the input terminal D of the D flip-flop 159 is high, the D flip-flop 159 outputs a high level signal in synchronization with a rising edge of the signal TF4 input to the CLK terminal.

Figure 5:
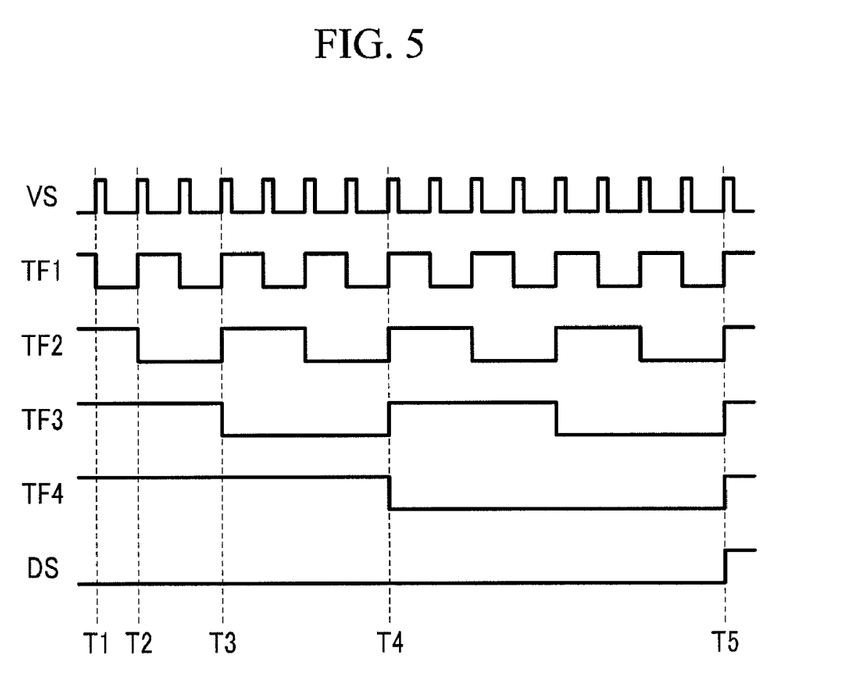
FIG. 5 is a waveform diagram for describing an operation of the conditional counter 150 according to an exemplary embodiment of the present invention.

FIG. 5 shows a waveform for describing the operation of the conditional counter 150 according to an exemplary embodiment of the present invention. Since an interval in which the sense voltage Vsense is higher than the reference voltage Vref3 is generated while the input voltage Vin is input, the current sense signal Imin becomes low during the interval. Therefore, the clear signal clr has a high level pulse, and the T flip-flops 155 to 158 are high level and the D flip-flop 159 is low level in the reset state.

When the output signal VS of the AND gate 151 becomes high at a time point T1, the inverting output signal TF1 becomes low in synchronization with the rising edge of the signal VS. At a time point T2, the inverting output signal TF1 becomes high in synchronization with the rising edge of the signal VS and the inverting output signal TF2 becomes low in synchronization with the rising edge of the inverting output signal TF1. At a time point T3, the inverting output signal TF1 becomes high in synchronization with the rising edge of the signal VS, the inverting output signal TF2 becomes high in synchronization with the rising edge of the inverting output signal TF1, and the inverting output signal TF3 becomes low in synchronization with the rising edge of the inverting output signal TF2. At a time point T4, the inverting output signal TF1 becomes high in synchronization with the rising edge of the signal VS, the inverting output signal TF2 becomes high in synchronization with the rising edge of the inverting output signal TF1, the inverting output signal TF3 becomes high in synchronization with the rising edge of the inverting output signal TF2, and the inverting output signal TF4 becomes low in synchronization with the rising edge of the inverting output signal TF3.

By repeating the above operation, at a time point T5, when the inverting output signal TF4 is rising, the D flip-flop 159 generates and outputs a high level signal DS. The output signal DS of the conditional counter 150 becomes high at a sixteenth rising edge of the signal VS. That is, when the input signal Vin is not input during counting the sixteenth rising edge of the signal VS, the signal DS becomes high at the sixteenth time point. Then, the BJT 147 is turned on and the turn-off time of the power switch 43 is determined by the sawtooth wave SW and the output reference voltage Vref5. And then, the switch controller 100 controls the switching operation of the power switch 43 by the predetermined threshold minimum duty.

The PWM controller 170 includes OR gates 171, 172, and 175, an SR flip-flop 173, and a timer 174. The PWM controller 170 receives output signals of the UVLO 110, the zero-current detector 120, the output voltage sensor 140, the first protection circuit 160, and the second protection circuit 165, and generates and outputs a gate driver control signal Vgc for controlling the switching operation of the power switch 43.

If the power switch 43 is not turned on during a predetermined period, the timer 174 forces the power switch 43 to turn on by the predetermined threshold minimum switching frequency, which is the same as a maximum switching period. For example, the predetermined period can be the same as the maximum switching period. That is, the timer 174 generates a high level on-time pulse signal fmin and outputs it to the OR gate 172 for turning on the power switch 43 when a high signal of the SR flip-flop 173 is sensed during the maximum switching period. Then, a high level signal is input to a set terminal S of the SR flip-flop 173 and the SR flip-flop 173 outputs a low level signal to the inverting output terminal $\overline{Q}$.

The OR gate 171 outputs a high level signal when at least one of an output signal of the second protection circuit 165 and the output voltage sensor 140 is high. Then, when a high level signal is input to a reset terminal R of the SR flip-flop 173, the SR flip-flop 173 outputs a high level signal to the OR gate 175 through the inverting output terminal $\overline{Q}$.

The OR gate 172 receives the output on-pulse signal fmin of the timer 174 and the output signal of the zero-current detector 120. When at least one of the two input signals is high, the OR gate 172 outputs a high level signal. Then, the high level signal is input to the set terminal S of the SR flip-flop 173 and the SR flip-flop 173 outputs a low level signal to the OR gate 175 through the inverting output terminal $\overline{Q}$.

When a high level signal is input to the set terminal S of the SR flip-flop 173, the SR flip-flop 173 outputs a low level signal to the inverting output terminal $\overline{Q}$. When a high level signal is input to the reset terminal R of the SR flip-flop 173, the SR flip-flop 173 outputs a high level signal to the inverting output terminal $\overline{Q}$. When low level signals are input to the set terminal S and the reset terminal R of the SR flip-flop 173, the SR flip-flop 173 maintains the present output state.

The OR gate 175 receives the output signal UVLO 110, the output signal of the first protection circuit 160, and the output signal of the SR flip-flop 173, and generates the gate driver control signal Vgc. The OR gate 175 outputs a high level gate driver control signal when at least one among the input signals is high and outputs a low level gate driver control signal when all the input signals are low.

The gate driver 180 includes a p-channel metal-oxide semiconductor field-effect transistor (PMOSFET) 181 and an n-channel metal-oxide semiconductor field-effect transistor (NMOSFET) 182, and outputs a high level voltage Vcc or a low level gate control signal Vgs having a low level grounded voltage according to the gate driver control signal Vgc. The voltage Vcc is applied to a source electrode of the PMOSFET 181 and a drain electrode of the PMOSFET 181 is connected to a drain electrode of the NMOSFET 182. A source electrode of the NMODFET 182 is grounded and the gate driver control signal Vgc is applied to gate electrodes of the PMOSFET 181 and the NMOSFET 182.

Accordingly, when a low level gate driver control signal Vgc is input to the gate driver 180, the gate driver 180 outputs a high level gate control signal Vgs. When a high level gate driver control signal Vgc is input to the gate driver 180, the gate driver 180 outputs a low level gate control signal Vgs being a ground voltage.

The first protection circuit 160 determines that there is a problem with the converter when the voltage Vo is so low or so high, and controls the switching operation of the power switch 43 to be stopped. The first protection circuit 160 includes hysteresis comparators 161 and 163 and reference voltage sources 162 and 164. The hysteresis comparator 163 has a high level output signal when the voltage Vo is higher than the reference range Vref7 according to the reference voltage source 164 and the power switch 43 is turned off. It is generated when the output voltage of the converter is high. In addition, the hysteresis comparator 161 has a high level output signal when the voltage Vo is lower than the reference range Vref6 according to the reference voltage source 162 and the power switch 43 is turned off.

The output of the NOR gate 113 becomes low when the signal PS becomes high, and the inverter 114 inverts the output of the NOR gate 113 and transmits a high level signal to the OR gate 175. Then, the gate driver 180 outputs the low level gate control signal Vgs to the power switch 43 and the power switch 43 is turned off. This can occur when the information regarding the output terminal of the converter is not input or the output terminal is opened.

The second protection circuit 165 senses the sense voltage Vsense, determines that an over-current flows through the power switch 43 when the sense voltage Vsense is greater than a predetermined voltage, and turns off the power switch 43 to protect the power switch 43. The second protection circuit 165 includes a resistor 166, a capacitor 167, a reference voltage source 168, and a comparator 169.

The comparator 169 compares a voltage of the reference voltage source 168 supplied to the inversion terminal (−) and the sense voltage Vsense input to the non-inversion terminal (+), and transmits a high level signal to the OR gate 171 of the PWM controller 170 when the sense voltage Vsense is greater than the voltage of the reference voltage source 163. Then, the OR gate 171 outputs the high level signal to the reset terminal of the SR flip-flop 173 and the SR flip-flop 173 outputs the high level signal to the OR gate 175. The gate driver 180 then outputs the low level gate control signal Vgs and turns off the power switch 43. The reference voltage generator 190 receives the voltage Vcc, and transforms the voltage Vcc to the reference voltage sources needed for operating the switch controller 100. The inner bias unit 191 receives the voltage Vcc and supplies a bias voltage to the switch controller 100.

Hereafter, referring to FIGS. 6 to 8, operation of the switch controller 100 according to an exemplary embodiment of the present invention will be described in detail.

Figure 6:
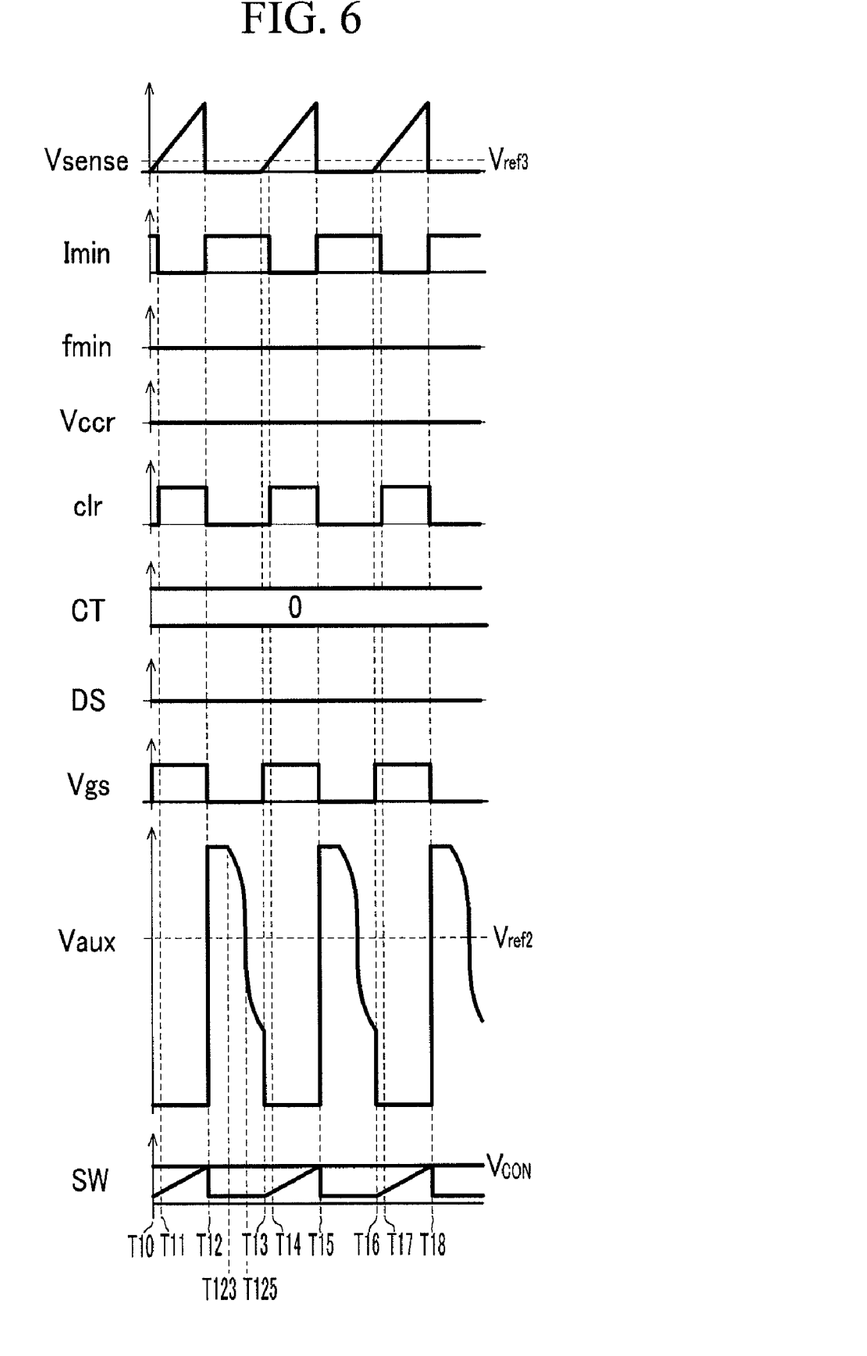
FIG. 6 shows a waveform of input and output signals and an inner signal of the switch controller 100 with a normal state operation of the converter according to an exemplary embodiment of the present invention.

FIG. 6 shows a waveform of input and output signals and an inner signal of the switch controller 100 with a normal state operation of the converter according to an exemplary embodiment of the present invention. In FIG. 6, a count result CT is the count result of the conditional counter 150. The output signals of the UVLO 110, the first protection circuit 160, and the second protection circuit 165 are set as low level. A normal state is defined such that the input voltage Vin is input and the output voltage Vout is constantly maintained.

At a time point T10, when the gate control signal Vgs becomes high, the power switch 43 is turned on and the sense voltage Vsense begins to increase according to the current flowing through the power switch 43. At a time point T11, when the sense voltage Vsense reaches the reference voltage Vref3, the current sense signal Imin becomes low and the clear signal clr becomes high. At a time point T12, when the sawtooth wave SW reaches the value of the signal Vcon, the gate control signal Vgs becomes low and the power switch 43 is turned off. Since the sense voltage Vsense becomes "0", the current sense signal Imin becomes high at the time point T12. Additionally, the clear signal clr becomes low.

The detection voltage Vaux has a resonance waveform after a time point T123. At a time point T13 that is delayed for a predetermined period from the time T125 when the detection voltage Vaux is the same as the reference range Vref2, the gate control signal Vgs becomes high. Then, the power switch 43 is turned on, and the sense voltage Vsense begins to increase according to the current flowing through the power switch 43. Processes after the time T13 are advanced in a like manner as above-described.

In the normal state, since the power switch 43 is not switching with the predetermined minimum switching frequency, the timer 174 does not generate a high level on pulse signal fmin. Then, since the conditional counter 150 does not count, the count result CT is "0". Accordingly, the signal DS is low.

Figure 7:
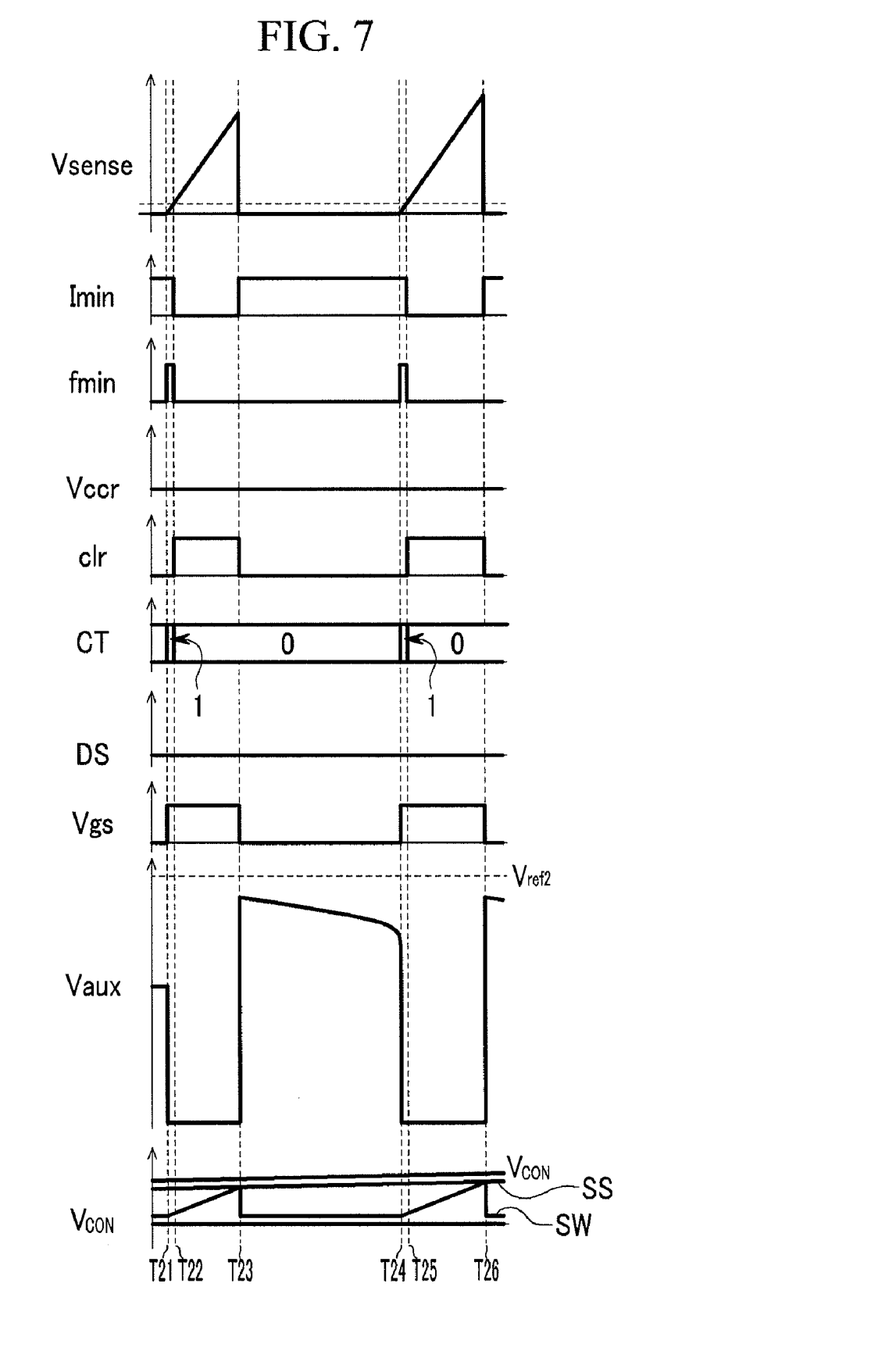
FIG. 7 shows a waveform of input and output signals and an inner signal of the switch controller 100 with a start-up operation of the converter according to an exemplary embodiment of the present invention.

FIG. 7 shows a waveform of input and output signals and an inner signal of the switch controller 100 with a start-up operation of the converter according to an exemplary embodiment of the present invention. At the start-up operation of the converter, since the output voltage Vout is low, the output signal Vcon of the error amplifier 144 is high. Then, the soft start signal SS becomes lower than the voltage Vcon. At the time when the sawtooth wave SW meets the soft start signal SS, the power switch 43 is turned off. At the start-up operation of the converter, since the detection voltage Vaux is not high to turn on the power switch 43, the on pulse signal fmin is needed to turn on the power switch 43 by force. In addition, a positive (+) voltage size of the detection voltage Vaux is defined as given in Equation 1.

$$V_{aux} = (V_{out} - V_{in}) \cdot \frac{N_{aux}}{N_{coil}} \quad \text{(Equation 1)}$$

Here, the Vin is an input voltage, the Vout is an output voltage, the Naux is a winding number of the detection inductor 42, and the Ncoil is a winding number of the inductor 41 of the converter. During a start-up operation period, the output voltage Vout is lower than the input voltage Vin and the detection voltage Vaux is lower than the reference voltage Vref2. Accordingly, during the start up operation period, since the detection voltage Vaux is low, the on pulse signal fmin turns on the power switch 43 by force.

As shown in FIG. 7, at the time point T21, when the on pulse signal fmin becomes high, the low level gate driver control signal Vgc is input to the gate driver 180. Then, the PMOSFET 181 is turned on and the gate control signal Vgs becomes high. When the power switch 43 is turned on by the high level gate control signal Vgs and a current flows through the power switch 43, the sense voltage Vsense increases. During the period when no current flows through the power switch 43 and the sense voltage Vsense is not generated, the current sense signal Imin is high.

At a time point T22, when the sense voltage Vsense reaches the reference voltage Vref3, the current sense signal Imin becomes low. During the periods T21 to T22, since the current sense signal Imin and the on pulse signal fmin are high, the conditional counter 150 counts "1". However, at the time point T22, the current sense signal Imin becomes low and the clear signal clr becomes high. Then, the conditional counter 150 resets the present count result as "0". At a time point T23, when the sawtooth wave SW reaches the soft start signal SS, the gate control signal Vgs becomes low, and the power switch 43 is turned off. Then, the sense voltage Vsense becomes a ground voltage and the current sense signal Imin becomes high, and the clear signal clr becomes low. At a time point T24, the timer 174 generates a high level on pulse signal fmin and the power switch 43 is turned on again. Remaining operations thereof are the same as those of the above-described exemplary embodiment of the present invention.

During a start-up operation period, the conditional counter 150 is able to count according to the on pulse signal fmin. However, since a current flows through the power switch 43 and the sense voltage Vsense is generated, and the sense voltage Vsense has a higher value than the reference voltage Vref3, the current sense signal Imin becomes low and the count result is reset. Accordingly, the signal DS is low.

Figure 8:
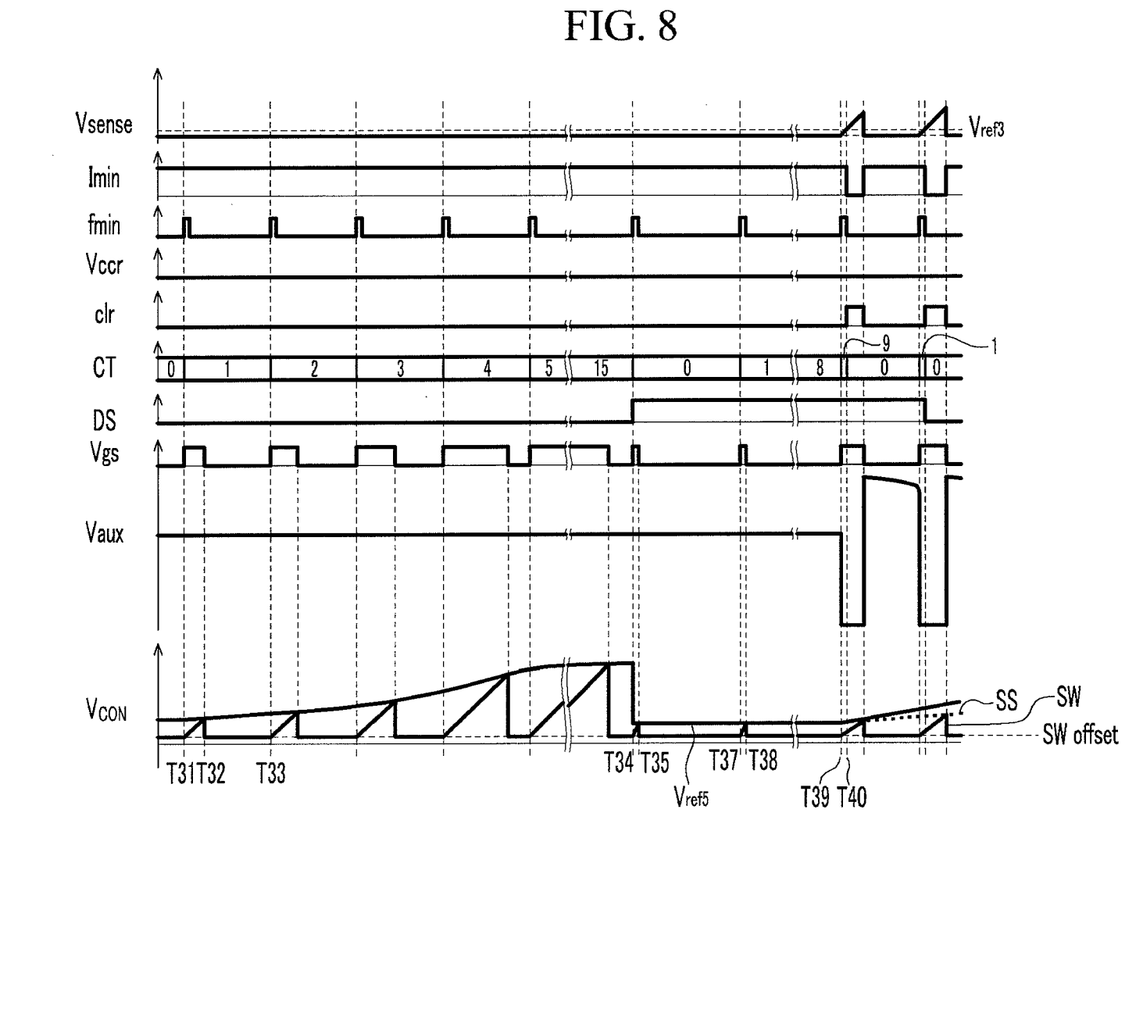
FIG. 8 shows a waveform of input and output signals and an inner signal of the switch controller 100 when an input voltage is not input to the converter according to an exemplary embodiment of the present invention.

FIG. 8 shows a waveform of input and output signals and an inner signal of the switch controller 100 when an input voltage is not input to the converter, according to an exemplary embodiment of the present invention. When the input voltage Vin is not input, the current flowing through the power switch 43 is not sensed. Accordingly, the timer 174 turns on the power switch 43 by using the on pulse signal fmin according to a minimum switching frequency and the sense voltage Vsense is not generated. While the conditional counter 150 counts 15, a turn-off time is determined by a time when the sawtooth wave SW meets with the signal Vaux. When the conditional counter 150 counts 16, the count result CT becomes "0" and the signal DS is high. According to an exemplary embodiment of the present invention, at the sixteenth count, the count result CT becomes "0" since the conditional counter 150 is a 4-bit counter. However, the present invention is not limited thereto, and the conditional counter having other bit numbers can be used.

During the period when the input voltage Vin is not input, the sense voltage Vsense is the ground voltage and the current sense signal Imin is high, and the clear signal clr is low. First, at a time point T31, when the on pulse signal fmin becomes high, the gate control signal Vgs becomes high and the power switch 43 is turned on. Since the current sense signal Imin and the on pulse signal fmin are high, the count result CT becomes "1". At a time point T32, when the sawtooth wave SW reaches the signal Vcon, the gate control signal Vgs becomes low. At a time point T33, when the on pulse signal fmin becomes high, the gate control signal Vgs becomes high and the power switch 43 is turned on. The processes are repeated as above-described.

After the count result CT becomes "15", at a time point T34, when the on pulse signal fmin becomes high, the signal DS becomes high and the signal Vcon becomes the output reference voltage Vref5. Since the offset level of the sawtooth wave SW is set by a voltage that is near the output reference voltage Vref5, the gate control signal Vgs is maintained in a high level state during short periods T35-T36. Then, the power switch 43 does a switching operation with a minimum duty. At a time point T37, when the on pulse signal fmin becomes high, the gate control signal Vgs becomes high. At a time point T38 when the sawtooth wave SW reaches the signal Vcon, the gate control signal Vgs becomes low. The operation is repeated at the time point T39 when the sense voltage Vsense starts to be generated by the input voltage Vin that is starting to be input.

At a time point T40, when the sense voltage Vsense becomes greater than the reference voltage Vref3, the current sense signal Imin becomes low and the clear signal clr becomes high. Then, the signal DS becomes low and the count result CT becomes "0". After the time point T39, the soft start signal SS is lower than the signal Vcon. Operations after the time point 39 are the same as those at the start-up operation described referring to FIG. 7.

According to an exemplary embodiment of the present invention, a switch controller and a converter using the same, and a driving method thereof, count a period when an input voltage is not input, control with a minimum duty when the count result is greater than a predetermined period, and control a switching operation of a power switch according to a soft start signal when the input voltage is again input.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A switch control device for controlling a switching operation of a power switch for controlling power transmission of a power transmission element, comprising:
   a PWM controller for forcing the power switch to turn on when the power switch is turned off during a predetermined period;
   a current sensor for sensing whether a current flows through the power switch; and
   a conditional counter for determining whether an input voltage is input to a power transmission element by using a sense result of the current sensor and a number of times that the PWM controller forces the power switch to turn on.

2. The switch control device of claim 1, wherein the PWM controller reduces a switching duty of the power switch when the input voltage is not input during a threshold period.

3. The switch control device of claim 2, wherein the PWM controller generates an on pulse signal to turn on the power switch when the power switch is turned off during the predetermined period.

4. The switch control device of claim 3, wherein the conditional counter counts a number of times that the on pulse signal is generated while no current flows through the power switch and determines that the input voltage is not input during the threshold period when the count result is greater than a predetermined threshold number corresponding to the threshold period.

5. The switch control device of claim 4, wherein the current sensor generates a current sense signal according to the sense result, and
   the conditional counter logically operates the on pulse signal and the current sense signal, generates a pulse signal according to the logical operation result, counts the generated pulse signals, and generates a disable signal to reduce the duty of the power switch when the count result of the generated pulse signal is the same as the threshold number.

6. The switch control device of claim 5, wherein the conditional counter includes:
   a logical operator for logically operating the on pulse signal and the current sense signal;
   a counter for counting the generated pulse signals; and
   a flip-flop for generating and maintaining the disable signal according to the result of the counter.

7. The switch control device of claim 5, wherein the conditional counter includes at least one T flip-flop corresponding to the threshold number, the result of the logical operator is input to a clock terminal of the at least one T flip-flop, and the at least one T flip-flop and the flip-flop are reset when a current flows through the power switch.

8. The switch control device of claim 5, wherein the current sensor receives a sense signal that corresponds to the current flowing through the power switch and determines that the current flows through the power switch when the sense signal is greater than a predetermined level.

9. The switch control device of claim 5, further comprising:
   an output voltage sensor that receives an output voltage sense signal corresponding to an output voltage according to the power transmitted from the power transmission element and generates an error amplification signal corresponding to the difference between the output voltage sense signal and a predetermined reference voltage; and
   a duty determination unit for determining a turn-off time of the power switch by using the error amplification signal, wherein the duty determination unit determines the turn-off time by using a predetermined output reference voltage instead of the error amplification signal according to the disable signal.

10. The switch control device of claim 9, wherein the output voltage sensor includes:
    an error amplifier for amplifying the difference between the output voltage sense signal and the predetermined reference voltage and for outputting the amplified difference; and
    a switching element for transmitting the output reference voltage to the duty determination unit in response to the disable signal.

11. The switch control device of claim 9, wherein the duty determination unit includes
    a comparator having a first terminal to which the error amplification signal and a second terminal to which a sawtooth wave signal having a predetermined frequency is input,
    wherein the output reference voltage instead of the error amplification signal is input to the first terminal according to the disable signal.

12. The switch control device of claim 11, wherein the output reference voltage is high and is near a lowest level of the sawtooth wave signal.

13. The switch control device of claim 5, further comprising:
    an output voltage sensor that receives the output voltage sense signal corresponding to an output voltage according to the power transmitted from the power transmission element and generates an error amplification signal corresponding to the difference between the output voltage sense signal and a predetermined reference voltage; and
    a duty determination unit for determining a turn-off time of the power switch by using a soft signal during a predetermined period from the time when the input signal begins to be input to the power transmission element and by using the error amplification signal after the predetermined period, wherein the duty determination unit determines the turn-off time by using a predetermined output reference voltage instead of the error amplification signal according to the disable signal.

14. The switch control device of claim 13, wherein the output voltage sensor includes:

an error amplifier for amplifying the difference between the output voltage sense signal and the predetermined reference voltage and for outputting the amplified difference; and a switching element for transmitting the output reference voltage to the duty determination unit in response to the disable signal.

15. The switch control device of claim 13, wherein the duty determination unit includes a comparator having a first terminal to which the error amplification signal and a second terminal to which a sawtooth wave signal having a predetermined frequency is input, wherein the output reference voltage instead of the error amplification signal is input to the first terminal according to the disable signal.

16. The switch control device of claim 15, wherein the comparator compares a lower signal between the soft start signal and error amplification signal and the sawtooth wave signal.

17. The switch control device of claim 15, wherein the output reference voltage is higher than a lowest level of the sawtooth wave signal.

18. A converter comprising:

a power transmission element;

a power switch that is connected to a first terminal of the power transmission element and controls power transmission through the power transmission element; and a switch controller for controlling a switching operation of the power switch, wherein the switch controller determines whether an input voltage is input to the power transmission element using a sensing current flowing through the power switch and counting a number of times that the power switch is turned on by a PWM controller by force, when the power switch is turned off during a predetermined period.

19. The converter of claim 18, wherein the switch controller reduces a switching duty of the power switch when the input voltage is not input during a threshold period.

20. The converter of claim 19, wherein the switch controller generates an on pulse signal to turn on the power switch when the power switch is turned off during a predetermined period.

21. The converter of claim 20, wherein the switch controller counts a number of times that the on pulse signal is generated while no current flows through the power switch and determines that the input voltage is not input during a threshold period when the count result is greater than a predetermined threshold number corresponding the threshold period.

22. The converter of claim 21, wherein the switch controller generates a current sense signal according to sensing the current flowing through the power switch, logically operates the on pulse signal and the current sense signal, generates a pulse signal according to the logical operation result, counts the generated pulse signal, and generates a disable signal to reduce the duty of the power switch when the count result of the generated pulse signal is the same as the threshold number.

* * * * *